United States Patent
Yamaguchi (10) Patent No.: US 7,807,997 B2
(45) Date of Patent: Oct. 5, 2010

(54) TEST ELEMENT GROUP (TEG) SYSTEM FOR MEASUREMENT OF SOI-MOSFET WITHOUT A BODY CONTACT COMPRISING FIRST AND SECOND TEGS OF UNEQUAL GATE ELECTRODE AREAS

(75) Inventor: Osamu Yamaguchi, Saitama (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/896,688

(22) Filed: Sep. 5, 2007

(65) Prior Publication Data
US 2008/0076196 A1    Mar. 27, 2008

(30) Foreign Application Priority Data
Sep. 27, 2006    (JP)    .............................. 2006-262209

(51) Int. Cl.
*H01L 23/58*    (2006.01)
*G01R 31/26*    (2006.01)
(52) U.S. Cl. ......................... 257/48; 324/765; 324/766; 324/769
(58) Field of Classification Search ................... 257/48, 257/288, 365; 324/765, 766, 769
See application file for complete search history.

(56) References Cited

U.S. PATENT DOCUMENTS
2004/0256676 A1* 12/2004 Hirotsu et al. ............... 257/369

FOREIGN PATENT DOCUMENTS
| JP | 2000-216258 | 8/2000 |
| JP | 2003121489 | 4/2003 |
| JP | 2004-253564 | 9/2004 |

* cited by examiner

*Primary Examiner*—Phat X Cao
*Assistant Examiner*—Diana C Garrity
(74) *Attorney, Agent, or Firm*—Rabin & Berdo, P.C.

(57) ABSTRACT

Two TEGs are used for acquiring FET capacity. A first TEG includes a first base section of the same shape and same dimensions as a gate electrode of the FET whose capacity is to be acquired, and a first additional section added at one end of the first base section. A second TEG includes a second base section of the same shape and same dimensions as the first base section, a second additional section having the same shape and same dimensions as the first additional section and added to one end of the second base section, and a third additional section having the same shape and same dimensions as the second additional section and added to the other end of the second base section. The capacity between the body and source or between the body and drain of the FET whose capacity is to be acquired is estimated from the difference in capacity between the body and source or between the body and drain of the first TEG and second TEG.

13 Claims, 8 Drawing Sheets

TEST ELEMENT GROUP (TEG) SYSTEM FOR MEASUREMENT OF SOI-MOSFET WITHOUT A BODY CONTACT COMPRISING FIRST AND SECOND TEGS OF UNEQUAL GATE ELECTRODE AREAS

BACKGROUND OF THE INVENTION

1. Field of the Invention

The present invention relates to a method of capacity acquisition of a semiconductor device and in particular relates to a method of capacity measurement of an SOI device that is not provided with a body contact. The present invention also relates to a TEG system for capacity measurement.

2. Description of the Related Art

In an SOI device, a semiconductor substrate layer and a transistor-forming layer formed thereon are insulated and isolated by a buried oxide film. Consequently, insulation and isolation between the adjacent elements can easily be achieved and the phenomenon of "latching up" can be prevented, since no parasitic thyristors are formed through the semiconductor substrate layer. Also, creating the transistors in the SOI layer is effective in suppressing the so-called short channel effect, in which the power consumption increases as the transistor is downsized. Since the junction capacity of the transistors formed in the SOI structure is smaller than in the case of transistors of bulk structure, high-speed operation can be achieved in the SOI structure. Thus transistors formed in the SOI structure have many excellent properties. In particular, higher speed operation and lower power consumption can be achieved in the SOI structure than in the case of semiconductor elements formed in a conventional bulk substrate.

Depending on the thickness of the semiconductor-forming layer (SOI layer), SOI devices may be classified into partially depleted SOIs (PD SOIs) and fully depleted SOIs (FD SOIs). An ordinary bulk structure CMOS process can be directly used in PD SOIs, and therefore PD SOIs can be manufactured less costly than FD SOIs. However, since PD SOIs have a thick(er) SOI layer (transistor forming layer), more hole accumulation takes place in the area directly above the insulating layer (channel underlayer area), due to the so-called impact ionization phenomenon. This results in a problem that a kink effect occurs in the current/voltage characteristic of the transistors. In order to solve this problem, a body contact region is provided in the transistor-forming layer in the case of PD SOIs. The body contact region fixes the body potential so that holes accumulated in the body region are removed. In contrast, in the case of an FD SOI, the SOI layer is much thinner, with the result that the kink effect does not occur. Therefore, normally a body contact region is not provided, and the body potential is floating.

A TEG (test element group) system is sometimes employed in order to ascertain the basic properties of a SOI device. An assessment of whether or not the device manufacturing process has been performed satisfactorily is made by evaluating for example the electrical properties and reliability of the transistors by using such a TEG. When LSI design engineers verify for example variations in LSI properties resulting from tolerances given to the structural elements, the type of circuit and the design values of constants, the engineers use computer simulation. The operation and properties of the circuit may be predicted using a computer, in order to control for example the performance and operational stability of the finished product. In this way, a reduction in the number of times trial manufacture is carried out and/or reduction in the amount of work involved can be achieved. When executing circuit simulation with a computer (simulator), the parameters of the elements constituting the circuit must be entered to the simulator. For a semiconductor device prepared by a new manufacturing process, parameters that are to be entered to the simulator are unknown. In this case, the necessary parameters are acquired from actual measurement data obtained using a TEG. Appropriate simulation results for the device are obtained by inputting to the simulator the parameters obtained based on the actual measurement.

Japanese Patent Application Kokai (Laid-Open) No. 2004-253564 discloses a method for measuring the capacity of parasitic transistors of a SOI device by using three TEGs with different electrode widths.

In the case of the PD SOI, the capacitance between the body and source or between the body and drain of a SOI transistor can easily be measured by probing between the source (drain) electrode and the body contact electrode. However, in the case of a device in which no body contact is provided (hereinbelow referred to as a "body floating type"), such as an FD SOI, direct measurement of the capacity is not possible.

In the case of a SOI device having a body contact, the gate electrode in the vicinity of the body contact is a so-called H-shaped or T-shaped gate. This gate electrode is larger than a gate electrode of a body floating type device. The capacity between the body and source (drain) of a device having a body contact is therefore larger than that of a device of the body floating type. Specifically, the capacity between the body and source (drain) is a combination of the junction capacity and gate capacity between the body and source (drain). Thus, it is affected by the gate electrode area. Consequently, the capacitance between the body and source (drain) measured in a device having a body contact cannot be applied directly to a body floating type device. If this value is nevertheless applied in the circuit simulation, the simulation results such as for example delay time diverge from actual measurements and circuit design etc cannot be accurately performed.

SUMMARY OF THE INVENTION

One object of the present invention is to provide a method for accurately finding the capacity between the body and source or between the body and drain of a SOI device that is not provided with a body contact.

Another object of the present invention is to provide a TEG system for evaluation purposes, which is used in the above-mentioned method.

According to a first aspect of the present invention, there is provided a TEG system for capacity measurement of an FET, that includes a first and second TEG each having an FET structure. The gate electrode of the first TEG has a different area size from the gate electrode of the second TEG.

According to a second aspect of the present invention, there is provided a capacity acquisition method using the above-described TEG system. The capacity acquisition method includes a first capacity measurement step of finding the capacity between the body and source or between the body and drain of the first TEG. The capacity acquisition method also includes a second capacity measurement step of finding the capacity between the body and source or between the body and drain of the second TEG. The capacity acquisition method also includes a first calculation step of subtracting the capacitance found in the first capacity measurement step from the capacitance found in the second capacity measurement step. The capacity acquisition method also includes a second calculation step of subtracting the value calculated in the first calculation step from the capacitance found in the first capacity measurement step. In this capacity acquisition method, the capacity between the body and source or between the body and drain is estimated taking into account the gate capacity component formed in a body floating type SOI-MOS FET, based on the capacity measured from the first and second TEGs having different gate electrode structures. Thus, an accurate capacitance can be obtained even in a SOI-MOS FET of the body floating type that does not have a body contact terminal.

According to a third aspect of the present invention, there is provided a semiconductor device design method using the above-described capacity acquisition method. Circuit simulation is executed using the acquired capacitance of the FET as a parameter, and a circuit including the FET is constructed based on the simulation results.

According to a fourth aspect of the present invention, there is provided a method of manufacturing a semiconductor device using the above-described capacity acquisition method. The semiconductor device manufacturing method includes a step of executing circuit simulation using the capacitance of the FET as a parameter.

DETAILED DESCRIPTION OF THE INVENTION

Embodiments of the present invention are described below with reference to the drawings. In the different drawings, structural elements or portions that are substantially the same or equivalent are given the same reference numerals and symbols. The description given below is for an N channel MOS FET; however, the invention could likewise be applied to a P channel MOS FET.

A first embodiment of the present invention will be described with reference to FIGS. 1 and 2. This embodiment is designed to accurately find the capacity between body and source and between body and drain of a SOI-MOS FET of the body floating type, that does not have a body contact.

Figure 1:
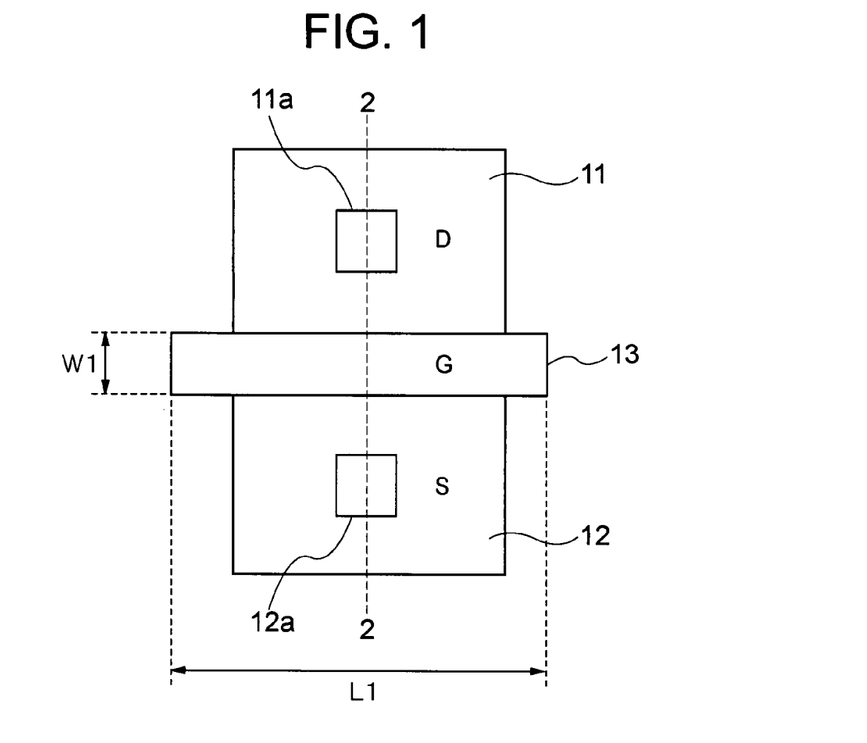
FIG. 1 is a top face view of a SOI-MOS FET of the body floating type whose capacity is to be found by a capacity acquisition method according to the present invention.
Figure 2:
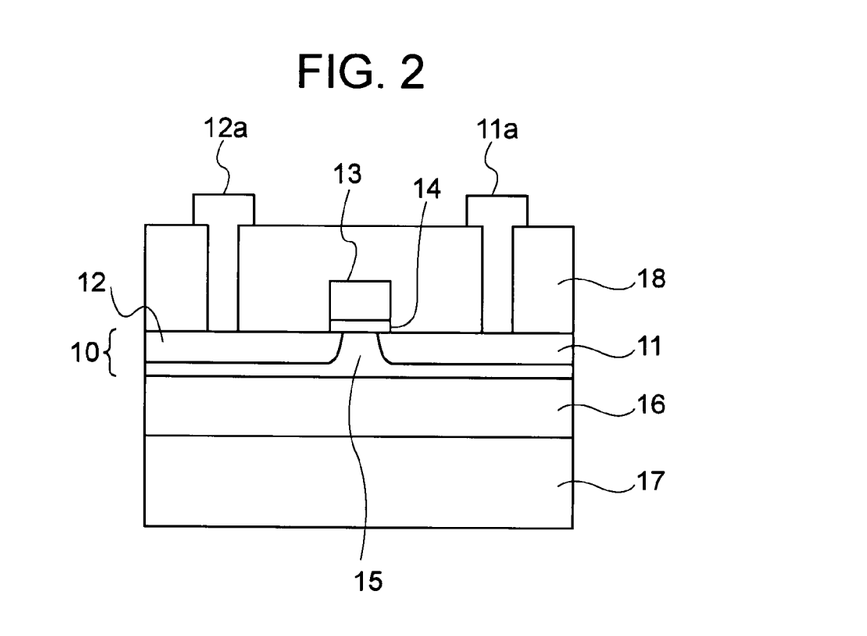
FIG. 2 is a cross-sectional view taken along the line 2-2 in FIG. 1.

In a body floating type SOI-MOS FET that is the subject of capacity acquisition, as shown in FIGS. 1 and 2, a buried oxide film 16 is formed on top of a silicon substrate layer 17, and a semiconductor layer 10 is formed on the buried oxide film 16. The oxide film 16 serves as an insulating layer. The semiconductor layer 10 is insulated from the silicon substrate layer 17 by the buried oxide film 16. An N channel MOS FET is formed in the semiconductor layer 10. Specifically, a drain region 11 and source region 12 made of heavily doped N+ diffusion layer are formed. A P-type channel region is formed between the drain region 11 and source region 12, and a body region 15 is formed by this channel region. Since this device has no body contact, the potential of the body region 15 is floating. A gate electrode 13 is formed on the body region 15 with a gate oxide film 14 interposed. The gate electrode 13 is formed by N+ polysilicon. As best shown in FIG. 1, the shape of the gate electrode 13 is a substantially rectangle of length L1 and width W1. The length L1 is taken in the longitudinal direction which is the direction substantially orthogonal to the direction of arrangement of the drain region 11, body region 15 and source region 12. An inter-layer insulating film 18 is formed on the semiconductor layer 10 and gate electrode 13. A drain electrode 11a and a source electrode 12a are respectively connected with the drain region 11 and source region 12.

As described above, a SOI-MOS FET constructed in this way has no body contact, so that the capacity between the body and source and between the body and drain cannot be directly measured. Accordingly, in the method of measuring capacity according to this embodiment, a TEG system having two TEGs is prepared. The two TEGs have body contacts and are used to accurately find the capacity between the body and source (drain) of a body floating type SOI-MOS FET, from the capacitance values acquired from these two types of TEG. The details thereof are described below.

Figure 3:
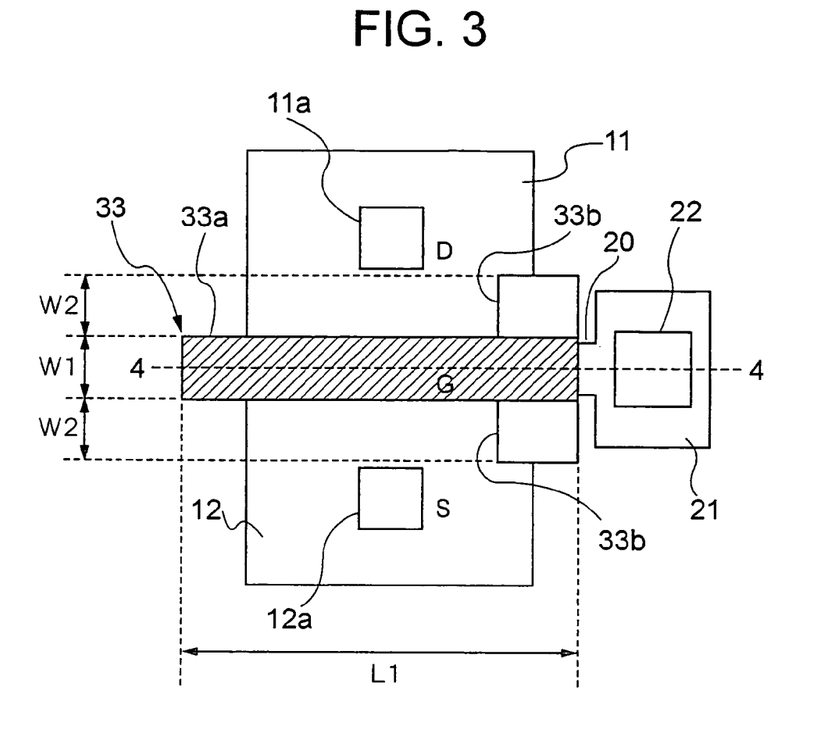
FIG. 3 is a top face view of a first TEG according to an embodiment of the present invention.
Figure 4:
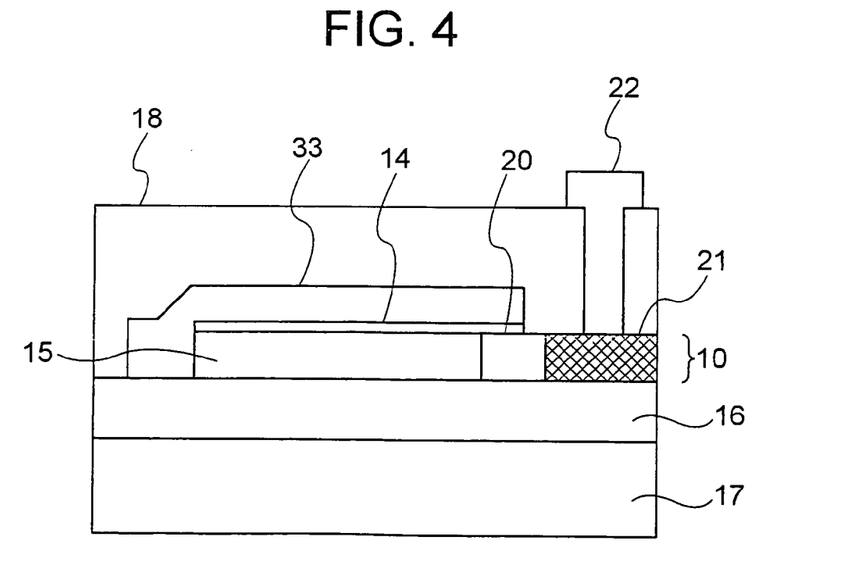
FIG. 4 is a cross-sectional view taken along the line 4-4 in FIG. 3.

FIG. 3 is a plan view of a SOI-MOS FET first TEG according to an embodiment of the present invention and FIG. 4 is a cross-sectional view taken along the line 4-4 in FIG. 3. The first TEG has a SOI structure in the same way as the body floating type SOI-MOS FET shown in FIGS. 1 and 2. A buried oxide film 16 is formed on a silicon substrate layer 17 and a semiconductor layer 10 is formed on the buried oxide film 16. An N channel MOS FET is formed on the semiconductor layer 10 and a drain region 11 and source region 12 made of heavily doped N+ diffusion layer are formed. A P-type channel region is formed between the drain region 11 and source region 12, and a body region 15 is formed by this channel region. The first TEG has a P-type body extension region 20 at one end of the body region 15. A body contact region 21 having a heavily doped P+ diffusion layer is formed at the tip of the body extension region 20. Specifically, the body region 15, the body extension region 20, and the body contact region 21 are all formed of P-type material and the body region 15 and the contact region 21 are of substantially the same potential. A body electrode 22 made of a metal such as aluminum is formed on the body contact region 21, so that the potential of the body region 15 can be extracted from outside the device. The body contact region 21 is formed by a highly doped P+ diffusion layer, and the contact resistance is thereby reduced by the formation of ohmic contact at the interface between the body contact region 21 and body electrode 22. The impurity diffusion concentration of the body extension region 20 is substantially the same order as the impurity diffusion concentration of the body region 15.

A gate electrode 33 is formed on the body region 15 and body extension region 20, with a gate oxide film 14 interposed. As shown in FIG. 3, the gate electrode 33 includes a first base section 33a and a first additional section 33b. The first base section 33a extends in a direction substantially orthogonal to the direction of arrangement of the drain region 11, body region 15 and source region 12. The first additional section 33b is formed by elongation by a length W2 on both sides sandwiching the first base section 33a at the end on the side where the body contact region 21 of the first base section 33a is formed. Thus, the first base section 33a and first additional section 33b constitute in combination a gate electrode which is substantially T-shaped. The width of the first base section 33a is W1 and its length is L1. The first base section 33a is formed of the same shape and same dimensions as the gate electrode 13 of the body floating type SOI-MOS FET whose capacity is sought to be acquired. In other words, the gate electrode 33 is constructed by adding (attaching) the first additional section 33b to the first base section 33a of the same shape and same dimensions as the gate electrode 13 of the body floating type SOI-MOS FET. In order to facilitate understanding, parts corresponding to the first base section 33a are shaded in FIG. 3.

The reason why the shape of the gate electrode 33 in the first TEG is substantially T-shaped is because the area of the end of the gate electrode 33 is expanded by providing the first additional section 33b and this portion is used as a mask when ion injection of P-type impurities is performed in order to form the body contact region 21. An inter-layer insulating film 18 is formed on the semiconductor layer 10 and gate electrode 33, and the drain region 11 and source region 12 are respectively formed with a drain electrode 11a and source electrode 12a.

Because the above-described first TEG has the first additional section 33b, the overall area of the gate electrode is larger than the area of the body floating type SOI-MOS FET gate electrode 13. Thus, the capacity between the body and drain and between the body and source become larger than in the case of a body floating type SOI-MOS FET.

Figure 5:
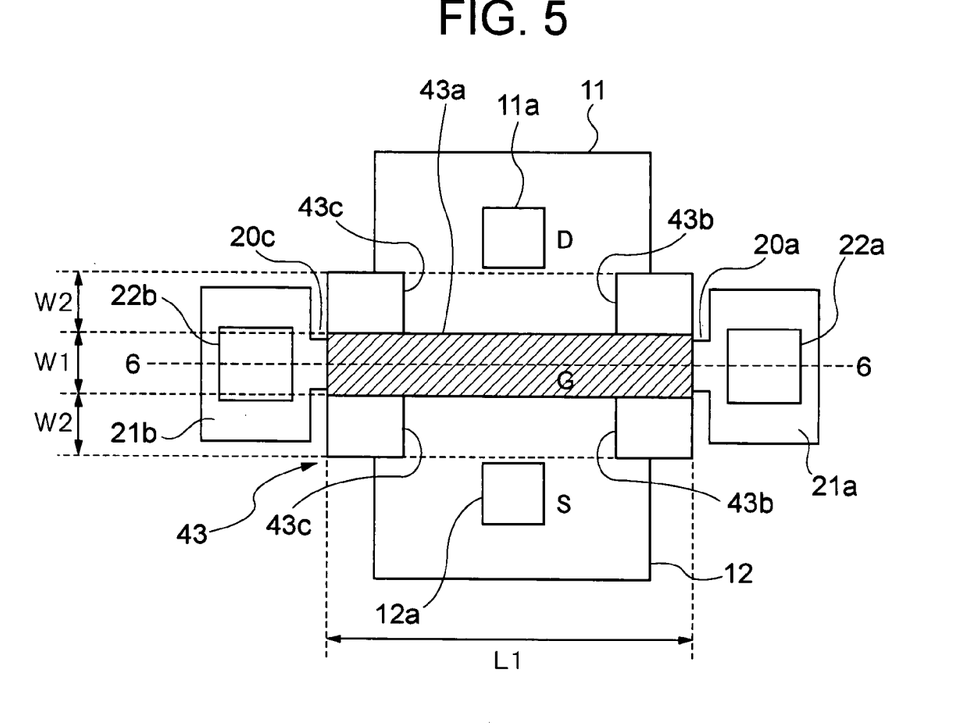
FIG. 5 illustrates a top face view of a second TEG according to an embodiment of the present invention.
Figure 6:
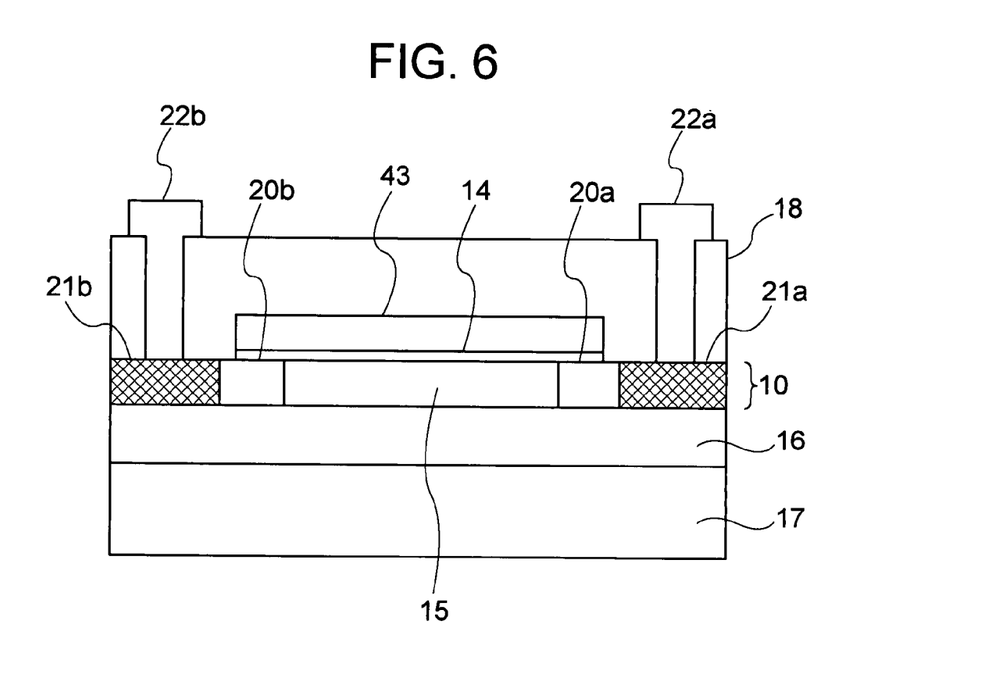
FIG. 6 is a cross-sectional view taken along the line 6-6 in FIG. 5.

Next, the second TEG will be described. FIG. 5 is a plan view of a second TEG constituted by a SOI-MOS FET, and FIG. 6 is a cross-sectional view taken along the line 6-6 in FIG. 5. The second TEG has a SOI structure in the same way as the body floating type SOI-MOS FET and first TEG. The second TEG includes a silicon substrate layer 17, buried oxide film 16 which serves as an insulating layer, and semiconductor layer 10. A drain region 11 and source region 12 made of heavily doped N+ diffusion layer are formed on the semiconductor layer 10. A P-type channel region is formed between the drain region 11 and source region 12, and a body region 15 is formed by this channel region. In the case of the second TEG, P-type body extension regions 20a, 20b are formed at both ends of the body region 15, and body contact regions 21a, 21b made of a heavily doped P+ diffusion layer are respectively formed at the tips of the body extension regions 20a, 20b. Specifically, the body region 15, the body extension regions 20a, 20b and the body contact regions 21a, 21b are entirely formed of P-type material and the body region 15 and the body contact regions 21a, 21b are at substantially the same potential.

Body electrodes 22a, 22b made of metal such as aluminum are respectively formed on the body contact regions 21a, 21b and the potential of the body region 15 is thereby extracted to outside the device. It should be noted that the impurity diffusion concentration of the body extension regions 20a, 20b is substantially the same order as that of the body region 15.

A gate electrode 43 is formed on the body region 15 and body extension regions 20a, 20b with a gate oxide film 14 interposed. As shown in FIG. 5, the gate electrode 43 has a second base section 43a, second additional section 43b and third additional section 43c. The second base section 43a extends in a direction substantially orthogonal to the direction of arrangement of the drain region 11, body region 15 and source region 12. The second additional section 43b and third additional section 43c are formed by elongation by a length W2 on both sides sandwiching the second base section 43a at both ends of the second base section 43a, thus constituting a gate electrode which is substantially H-shaped. The second and third additional sections that are formed in this second TEG are both formed with the same shape and same dimensions as the first additional section 33b formed in the first TEG. The second additional section has the same area as the third additional section. Specifically, the gate electrode 43 that is formed on the second TEG has a construction in which a third additional section 43c of the same shape and same dimensions as the first additional section 33b is additionally coupled with the gate electrode 33 formed in the first TEG. Just as in the case of the first TEG, the width of the second base section 43a is W1 and its length is L1. In other words, the second base section 43a has the same shape and same dimensions as the gate electrode 13 of the body floating type SOI-MOS FET and the first base section 33a formed in the first TEG. In order to facilitate understanding, parts corresponding to the second base section 43a are shaded in FIG. 5.

Since the second TEG has the second and third additional sections 43b, 43c, the second TEG has a larger area of the gate electrode than the area of the gate electrode of the body floating type SOI-MOS FET and than the gate electrode 33 of the first TEG. Thus, the capacity between the body and drain and between the body and source is larger than in the case of these SOI-MOS FETs.

Figure 7A:
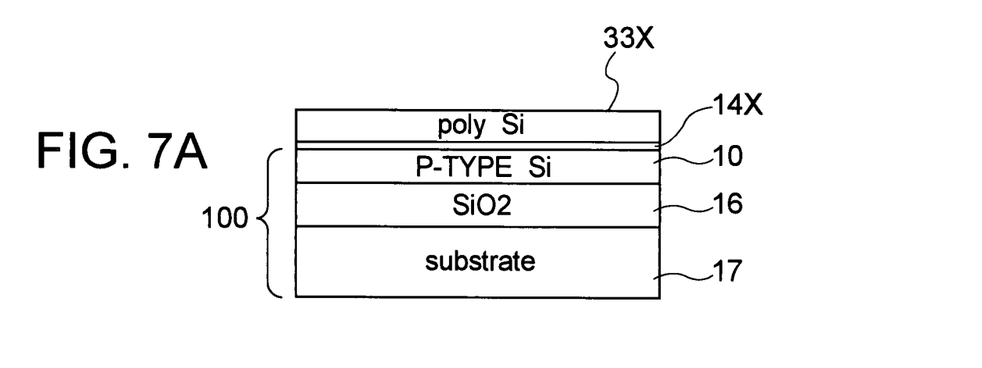
FIGS. 7A to 7D are a series of diagrams useful to explain a method of manufacturing the first TEG and second TEG.

Next, the manufacturing process of the first TEG and second TEG will be described with reference to FIGS. 7A to 7D. First, a buried oxide film 16 made of silicon oxide film of thickness for example 400 nm is formed on a silicon substrate 17, and a P-type semiconductor layer 10 of thickness for example 50 nm is formed on the buried oxide film 16. Thus, a SOI substrate 100 is prepared. The semiconductor layer 10 is insulated and isolated from the silicon substrate 17 by the buried oxide film 16. A gate oxide film 14X of thickness for example 500 Å made of a silicon oxide film is then formed on the semiconductor layer 10 of the SOI substrate 100, and a polysilicon film 33X is formed on top of the gate oxide film 14X by the CVD method (FIG. 7A).

Figure 7B:
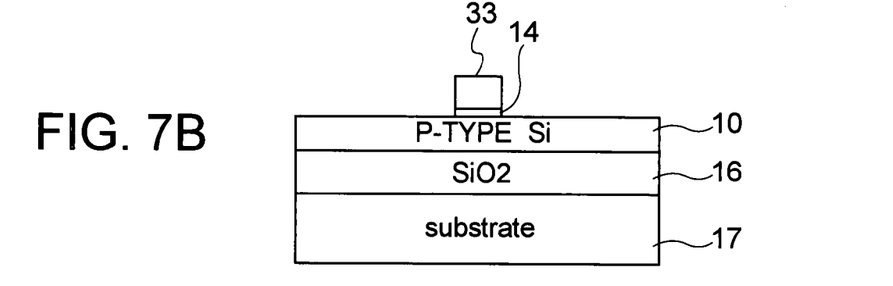

Next, a resist for gate electrode formation is formed on the polysilicon film 33X, and a T-shaped gate electrode 33 or H-shaped gate electrode 43 is formed by etching the polysilicon film 33X and gate oxide film 14 using this resist as a mask. After this, the resist is removed (FIG. 7B).

Figure 7C:
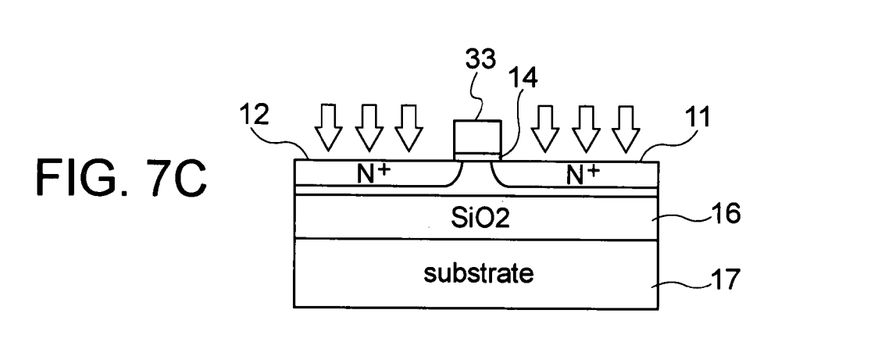

Next, arsenic is implanted into the semiconductor layer 10 by ion implantation, using the gate electrode 33 (43) as a mask, and the drain region 11 and source region 12, which are constituted by highly doped N+ diffusion layers, are formed by thermal diffusion. In addition, boron is implanted into the semiconductor layer 10 by ion implantation using the gate electrode 33 (43) as a mask, and the body contact regions 21 (21a, 21b), which are constituted by highly doped P+ diffusion layers, are formed by thermal diffusion (FIG. 7C).

Figure 7D:
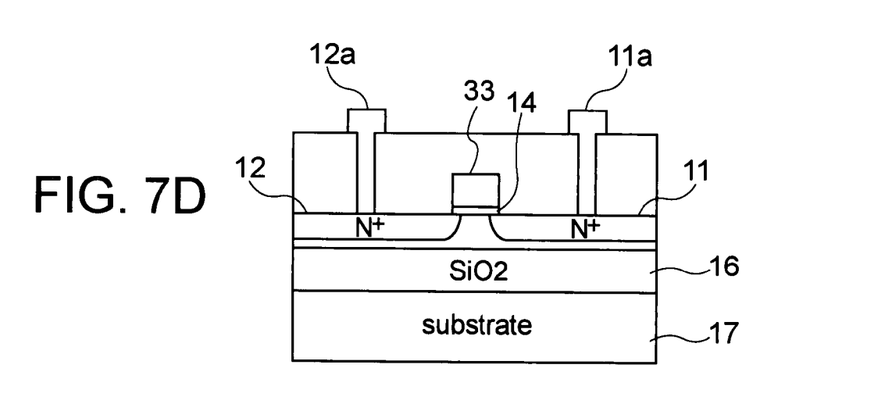

Next, an inter-layer insulating film 18 is formed on the entire surface and contact holes are formed in the inter-layer insulating film 18 in portions positioned on the gate electrode 33(43), drain region 11, source region 12 and body contact region 21. Metal such as aluminum is deposited on the entire surface by a vacuum evaporation technique. Next, an electrode wiring pattern is formed by a resist, and unwanted portions are removed by etching, thereby forming the drain electrode 11a, source electrode 12a, gate electrode wiring (not shown) and body electrodes 22 (22a, 22b). After this, sintering is performed at about 500 degrees C. (° C.) in order to achieve good electrical connection between the electrode material and the silicon (FIG. 7D).

A first TEG and second TEG are formed by the above described steps. The SOI substrate 100, the thickness of the gate oxide film 14, the method of forming the gate electrode 33 (43) and ion implantation conditions etc are preferably the same as in the case of the body floating type SOI-MOS FET whose capacity is to be found. Preferably the first TEG and second TEG are adjacently formed on the wafer surface so as to eliminate the effect of manufacturing variations in the wafer surface. As described below, the method of capacity acquisition according to this embodiment utilizes the capacity difference found from the difference in gate electrode area between the first TEG and second TEG. Thus, influences on capacity difference between the first TEG and second TEG due to other factors apart from the difference of gate electrode area must be avoided to the utmost. To this end, variations in the diffusion temperature and in the amount of ion implantation in the wafer surface are suppressed or eliminated by providing the first TEG and second TEG close to each other in the wafer surface. It should be noted that the first and second TEG could be formed within the same chip or could be formed separately in different chips. If mass production of ICs including body floating type SOI-MOS FETs whose capacity is to be measured is needed, the first TEG and the second TEG may be formed in part of the wafer used for such mass-production. In this way, capacity measurement according to the present invention can be performed for each wafer and an evaluation of whether or not the wafer is satisfactory can be performed using the result of capacity measurement.

Figure 8:
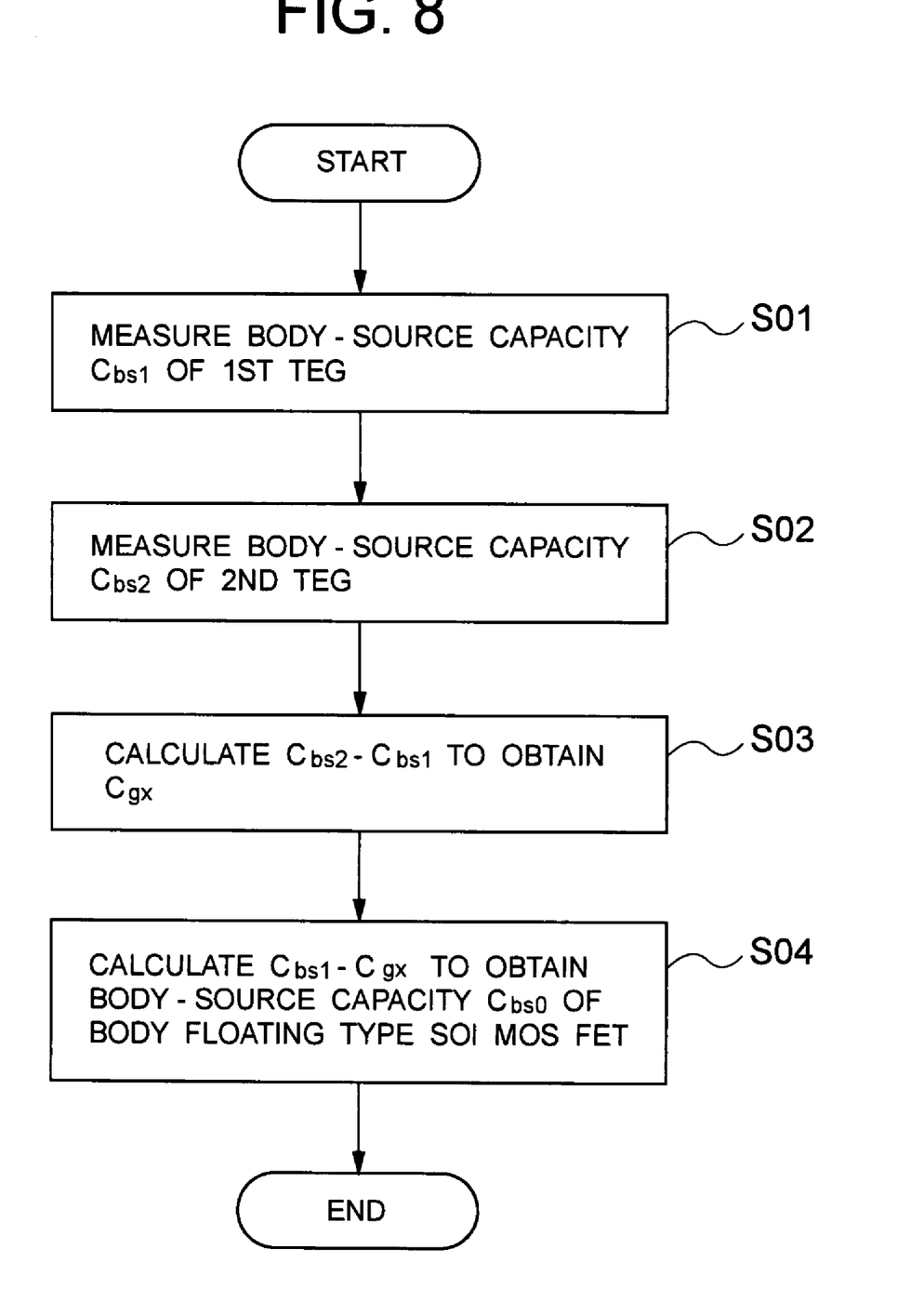
FIG. 8 is a flow chart showing a method of capacity acquisition according to an embodiment of the present invention.

Next, a method of accurately finding the capacity between the body and drain and between the body and source of a body floating type SOI-MOS FET using the first TEG and second TEG prepared by the above-described manufacturing steps will be described with reference to the flow chart of FIG. 8. Although the description given below deals with the case of finding the capacity between the body and source, the capacity between the body and drain can be found by the same technique.

Figure 9:
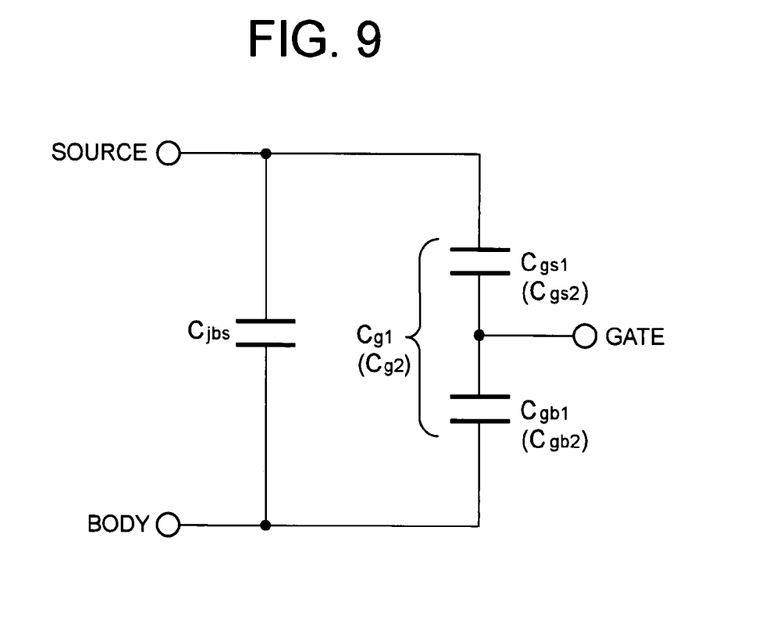
FIG. 9 shows the coupled condition of the capacity components in a SOI-MOS FET.

First, the capacity between the body and source of the first TEG is measured by probing between the source electrode 12a and body electrode 22 of the first TEG (Step S01). FIG. 9 shows the coupling condition of the capacitative components in a SOI-MOS FET. The capacity $C_{bs1}$ obtained by the measurement in Step S01 is the combined capacity of the junction capacity $C_{jbs}$ and the gate capacity $C_{g1}$ between the body and source, and can be expressed by the following equation:

$$C_{bs1} = C_{jbs} + C_{g1} \quad (1)$$

where the gate capacity $C_{g1}$ is the capacitative component generated by gate electrode formation. The gate capacity $C_{g1}$ is the combined capacity of the capacity $G_{gs1}$ between the gate and source and the capacity $C_{gb1}$ between the gate and the body, and has a value corresponding to the area of the T-shaped gate electrode 33 formed in the first TEG.

Next, the capacity between body and source of the second TEG is measured by probing the source electrode 12a and the body electrode 22a of the second TEG (Step S02). The capacity $C_{bs2}$ obtained by the measurement of this Step S02, just as in the case of the first TEG, is the combined capacity of the junction capacity $C_{jbs}$ between the body and source and the gate capacity $C_{g2}$, and can be expressed by the following equation:

$$C_{bs2} = C_{jbs} + C_{g2} \quad (2)$$

where the gate capacity $C_{g2}$ is the capacitative component generated by gate electrode formation. The gate capacity $C_{g2}$ is the combined capacity of the capacity $C_{gs2}$ between the gate and source and the capacity $C_{gb2}$ between the gate and the body, and has a value corresponding to the area of the H-shaped gate electrode 43 formed in the second TEG.

Next, the value of the capacity $C_{bs1}$ obtained in Step S01 is subtracted from the value of the capacity $C_{bs2}$ obtained in Step S02 (Step S03). From the equations (1) and (2), the value $C_{gx}$ obtained by this calculation can be expressed by the following equation:

$$C_{gx} = C_{bs2} - C_{bs1} = C_{g2} - C_{g1} \quad (3)$$

Figure 10A:
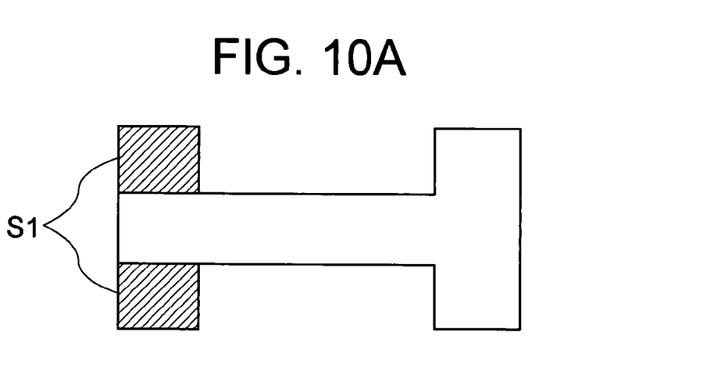
FIGS. 10A and 10B are diagrams useful to explain the capacity acquisition method.

It can be said from the equation (3) that the value $C_{gx}$ obtained as a result of this calculation corresponds to the value obtained by subtracting the value of the gate capacity $C_{g1}$ obtained using the T-shaped gate electrode 33 formed in the first TEG from the value of the gate capacity $C_{g2}$ obtained using the H-shaped gate electrode 43 formed in the second TEG. The gate capacities $C_{g1}$ and $C_{g2}$ are both in proportional to the area of the gate electrode and, as shown in FIG. 10A, the value of the capacitance $C_{gx}$ expresses the gate capacity corresponding to the area of the shaded section S1 in the FIG. 10A, obtained by subtraction of the area of the T-shaped gate electrode 33 from the area of the H-shaped gate electrode 43. The shaded section S1 corresponds to the third additional section 43c of the H-shaped gate electrode 43. The shaded section S1 also corresponds to the first additional section 33b of the T-shaped gate electrode 33 because the first additional section 33b has the same shape and the same dimensions as the third additional section 43c.

Next, the value of $C_{gx}$ obtained in Step S03 is subtracted from the value of $C_{bs1}$ obtained in Step S01 (Step S04). If the equation (1) is used, the value of $C_{bs0}$ obtained by this calculation can be expressed by the following equation:

$$C_{bs0} = C_{bs1} - C_{gx} = C_{jbs} + (C_{g1} - C_{gx}) \quad (4)$$

Figure 10B:
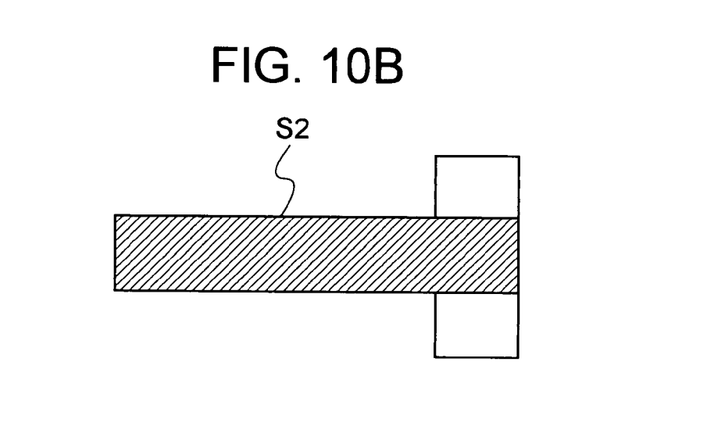

It can be said from the equation (4) that the value $C_{bs0}$ obtained as a result of this calculation corresponds to a value obtained by adding together the body-source junction capacity $C_{jbs}$ and a value obtained by subtracting the value of $C_{gx}$ calculated in the Step S03 from the value of the gate capacity $C_{g1}$ obtained using the T-shaped gate electrode 33 of the first TEG. The term $C_{g1}-C_{gx}$ in brackets in the equation (4) indicates the gate capacitance corresponding to the area of the shaded section S2 of FIG. 10B, obtained by subtracting the area of the shaded section S1 in FIG. 10A corresponding to the capacity $C_{gx}$ from the area of the T-shaped gate electrode 33 corresponding to the capacity $C_{g1}$. Specifically, since the shaded section S1 of the T-shaped gate electrode is a portion corresponding to the first additional section 33b expanded with the formation of the body contact, the shaded section S2 may be described as a portion of the T-shaped gate electrode 33, excluding the first additional section 33b, i.e., the first base section 33a. Since the first base section 33a is formed of the same shape and same dimensions as the gate electrode 13 of the body floating type SOI-MOS FET, the bracketed term $C_{g1}-C_{gx}$ in the equation (4) corresponds to the gate capacity of the body floating type SOI-MOS FET. In other words, the term $C_{bs0}$, indicating the value obtained by adding the bracketed term $C_{g1}-C_{gx}$ corresponding to the gate capacity of the body floating type SOI-MOS FET and the junction capacity $C_{jbs}$ between the body and source, is none other than the capacity between the body and source of the body floating type SOI-MOS FET. By performing the above-described steps, the capacity between the body and source of a body floating type SOI MOS FET that is not equipped with a body contact can be accurately found.

It should be noted that the method of finding the capacity between the body and source (drain) of a body floating type SOI MOS FET is not limited to the example described above, and the capacity in question could be found by other methods. One example of such "other methods" is described below with reference to the flow chart of FIG. 11.

Figure 11:
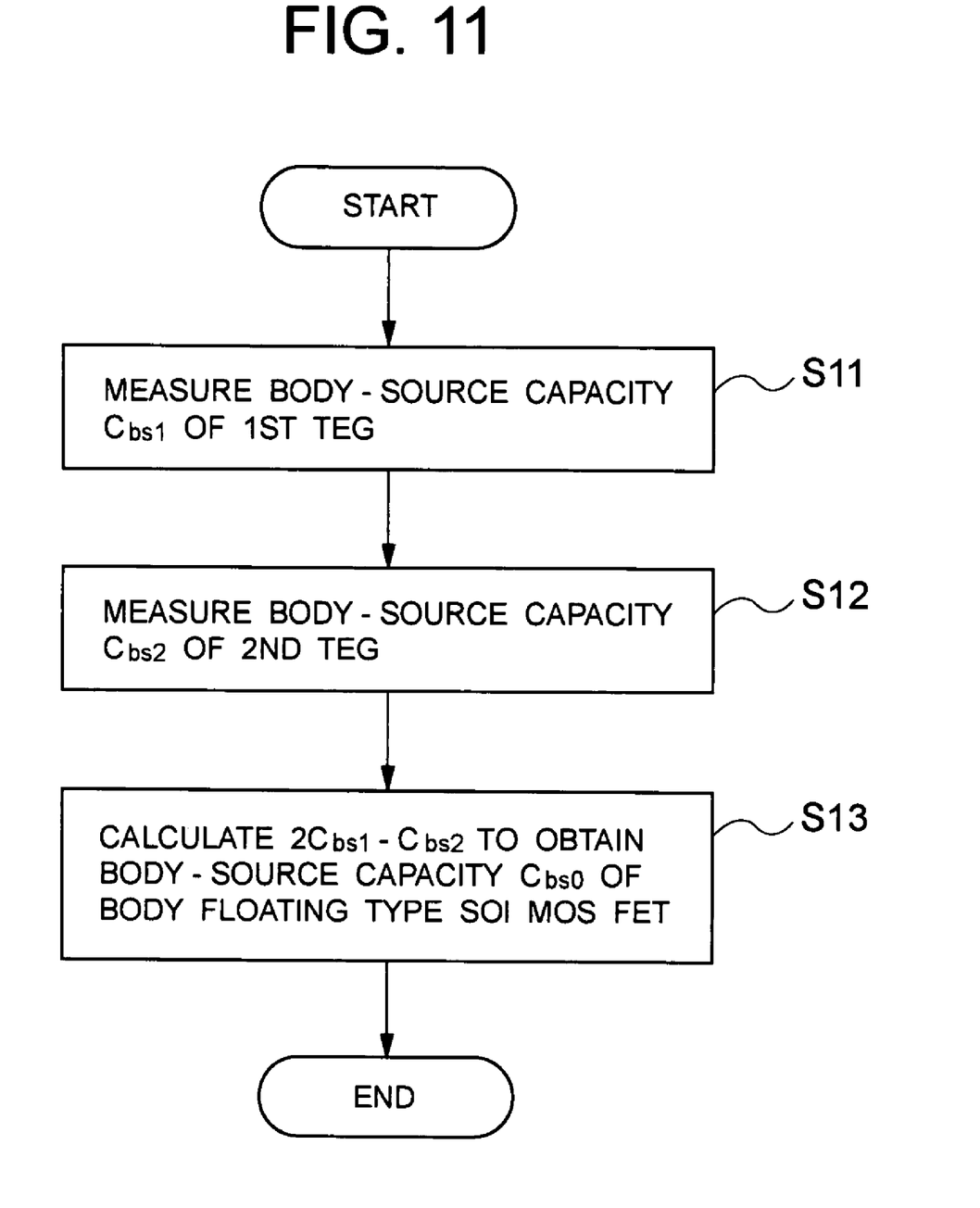
FIG. 11 is a flow chart showing another method of capacity acquisition according to the present invention.

First, the capacity between the body and source is measured in a first TEG by probing between the source electrode 12a and the body electrode 22 of the first TEG (Step S11). The capacity $C_{bs1}$ that is thereby obtained is the combined capacity of the junction capacity $C_{jbs}$ between the body and source and the gate capacity $C_{g1}$, and can be expressed by the following equation:

$$C_{bs1}=C_{jbs}+C_{g1} \quad (5)$$

Next, the capacity between the body and source in a second TEG is measured by probing between the source electrode 12a and the body electrode 22a of the second TEG (Step S12). The capacity $C_{bs2}$ that is thereby obtained is the combined capacity of the junction capacity $C_{jbs}$ between the body and source and the gate capacity $C_{g2}$, and can be expressed by the following equation:

$$C_{bs2}=C_{jbs}+C_{g2} \quad (6)$$

Next, the value of the capacity $C_{bs2}$ obtained in Step S12 is subtracted from a value obtained by doubling the value of the capacity $C_{bs1}$ obtained in Step S11 (Step S13). From the equations (5) and (6), the value $C_{bs0}$ that is obtained by this calculation can be expressed by the following equation:

$$C_{bs0}=2C_{bs1}-C_{bs2}=C_{jbs}+(2C_{g1}-C_{g2}) \quad (7)$$

where the bracketed term $2C_{g1}-C_{g2}$ indicates the gate capacity corresponding to the area obtained by subtracting the area of the H-shaped electrode from the result of doubling the area of the T-shaped gate electrode 33. Specifically, $2C_{g1}-C_{g2}$ is the gate capacity corresponding to the area of the first base section 33a of the T-shaped gate electrode, i.e., the gate capacity of the floating type SOI-MOS FET. Consequently, the value $C_{bs0}$ obtained as a result of the calculation of Step S13 represents the capacity between the body and source of the floating type SOI-MOS FET.

Figure 12:
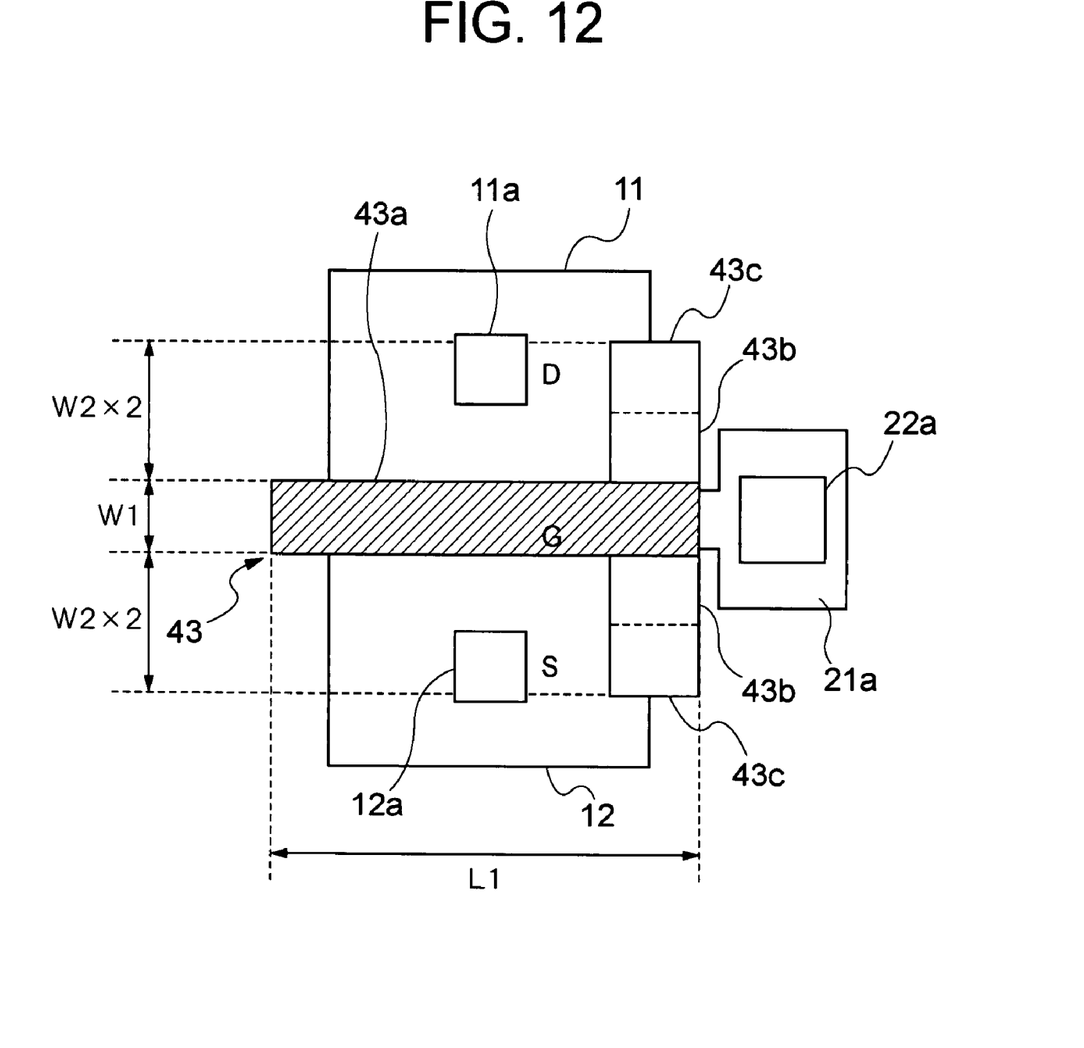
FIG. 12 is a plan view of another example of a second TEG.

It should be noted that, although, in the embodiment described above, a substantially T-shaped gate electrode is formed in the first TEG and a substantially H-shaped gate electrode is formed in the second TEG, there is no limitation in this regard. Specifically, the gate electrode of the first TEG may have an arbitrary shape as long as the gate electrode has a first base section of the same shape and same dimensions as the gate electrode of the body floating type SOI-MOS FET whose capacity is to be found and is formed with a first additional section constituting an expanded section necessary for forming a body contact at one end thereof. Likewise, the gate electrode of the second TEG may have an arbitrary shape as long as the gate electrode is formed with second and third additional sections of the same shape and same dimensions as the first additional section of the first TEG. FIG. 12 illustrates another embodiment of the second TEG. As shown in this drawing, the third additional section 43c may have a construction that is unitarily formed with the second additional section 43b. In this case, the second additional section 43b can be regarded as having twice the area of the first additional section 33b of the first TEG. It should be noted that, in this case, the body contact region may be formed solely at a single location on the side where the second and third additional section are provided in the second TEG.

As understood from the above description, a TEG system for evaluation purposes according to the present invention is constituted by two TEGs having body contacts and having different gate electrode areas (different gate electrode sizes). Specifically, the first TEG has substantially a T-shape including a first base section of the same shape and same dimensions as the gate electrode of the body floating type SOI-MOS FET that is the subject of capacity acquisition and a first additional section that is added at one end of the first base section. In contrast, the second TEG has substantially an H-shape including a second base section of the same shape and same dimensions as the first base section, a second additional section of the same shape and same dimensions as the first additional section that is added at one end of the second base section, and a third additional section of the same shape and same dimensions as the second additional section that is added at the other end of the second base section.

With the method of capacity acquisition according to the present invention, it is possible to obtain an accurate capacity value even in the case of a body floating type SOI-MOS FET that has no body contact terminal, since the capacity between the body and source or between the body and drain can be estimated, taking into account the gate capacity of a body floating type SOI-MOS FET, based on the capacity between body and source or capacity between body and drain measured from first and second TEGs provided with a gate electrode structure. Thus, when simulation of a circuit including a body floating type SOI-MOS FET is performed by means of a circuit simulator, accurate parameters obtained from actual measurements can be input to the simulator, and the reliability of the simulation results can therefore be enhanced. Specifically, by employing the capacity measurement method according to the present invention, design and manufacture of a semiconductor device becomes possible with an accurate simulating operation. For example, by inputting to a simulator the capacitance obtained by the method of capacity acquisition according to the present invention, delay time of a circuit including a body floating type SOI-MOS FET can be acquired by circuit simulation, and the delay time can be used in design and manufacture of a semiconductor device by for example altering the circuit constants and adjusting the gate oxide film thickness such that the delay time falls within the allowed range.

This application is based on Japanese Patent Application No. 2006-262209 filed on Sep. 27, 2006 and the entire disclosure thereof is incorporated herein by reference.

What is claimed is:

1. An arrangement for measurement of capacitance of a target SOI-MOSFET, said target SOI-MOSFET being a body-floating-gate type MOSFET and having a first source electrode, a first drain electrode, a first gate electrode, and a first body but having no body contact, said arrangement comprising:

a first test element group (TEG) for measuring capacitance between two elements of the first TEG, said first TEG being a SOI-MOSFET having a second source electrode, a second drain electrode, a second gate electrode, a second body, and a first body contact, said second gate electrode having a shape defined by a combination of said first gate electrode and a first additional shape, and said two elements of the first TEG being the second body and the second source electrode or being the second body and the second drain electrode; and a second TEG for measuring capacitance between two elements of the second TEG, said second TEG being a SOI-MOSFET having a third source electrode, a third drain electrode, a third gate electrode, third body, and a second body contact, the second gate electrode of said first TEG having a different shape than the third gate electrode of said second TEG, said third gate electrode having a shape defined by a combination of said first gate electrode, said first additional shape and a second additional shape, said first additional shape being exactly the same shape as said second additional shape, and said two elements of the second TEG being the third body and the third source electrode or being the third body and the third drain electrode, said capacitance to be measured being the capacitance between the first body and first source electrode or between the first body and the first drain electrode.

2. The arrangement according to claim 1,
wherein the second gate electrode of said first TEG is T-shaped, and
wherein the third gate electrode of said second TEG is T-shaped or H-shaped.

3. The arrangement according to claim 1, wherein said first and second TEGs are adjacently provided in the same wafer surface.

4. The arrangement according to claim 1, wherein said target SOI-MOSFET, said first TEG and said second TEG are provided in the same wafer surface.

5. The arrangement according to claim 1, wherein said second TEG is a P channel SOI-MOSFET when said first TEG is a P channel SOI-MOSFET, and said second TEG is an N channel SOI-MOSFET when said first TEG is an N channel SOI-MOSFET.

6. The arrangement according to claim 1, wherein the first source electrode of said target SOI-MOSFET, the second source electrode of said first TEG and the third source electrode of said second TEG have the same shape, and the first drain electrode of said target SOI-MOSFET, the second drain electrode of said first TEG and the third drain electrode of said second TEG have the same shape.

7. An FET capacitance acquisition method using the arrangement of claim 1, the method comprising:
a first capacitance measurement step of finding a first capacitance between the second body and second source electrode of said first TEG or between the second body and second drain electrode of said first TEG;
a second capacitance measurement step of finding a second capacitance between the third body and third source electrode of said second TEG or between the third body and third drain electrode of said second TEG;
a first calculation step of subtracting the first capacitance found in said first capacity measurement step from the second capacitance found in said second capacity measurement step; and
a second calculation step of subtracting the value calculated in said first calculation step from the first capacitance found in said first capacitance measurement step.

8. A semiconductor device design method using the FET capacitance acquisition method of claim 7, wherein circuit simulation is executed using the acquired capacitance of said FET as a parameter, and a circuit including said FET is constructed based on the obtained simulation results.

9. A method of manufacturing a semiconductor circuit device using the FET capacitance acquisition method of claim 7, comprising a step of executing circuit simulation using the acquired capacitance of said FET as a parameter.

10. An FET capacitance acquisition method using the arrangement of claim 1, the method comprising:
a first capacitance measurement step of finding a first capacitance between the second body and second source electrode of said first TEG or between the second body and second drain electrode of said first TEG;
a second capacitance measurement step of finding a second capacitance between the third body and third source electrode of said second TEG or between the third body and third drain electrode of said second TEG; and
a calculation step of subtracting the second capacitance found in said second capacitance measurement step from a value obtained by doubling the capacitance found in said first capacitance measurement step.

11. A semiconductor device design method using the FET capacitance acquisition method of claim 10, wherein circuit simulation is executed using the acquired capacitance of said FET as a parameter, and a circuit including said FET is constructed based on the obtained simulation results.

12. A method of manufacturing a semiconductor circuit device using the FET capacitance acquisition method of claim 10, comprising a step of executing circuit simulation using the acquired capacitance of said FET as a parameter.

13. An arrangement for measurement of capacitance of a target SOI-MOSFET, comprising:
a first test element group (TEG), said first TEG comprising a SOI-MOSFET having a first source electrode that extends to a first source region in a semiconductor layer, a first drain electrode that extends to a first drain region in the semiconductor layer, a first gate electrode, a first body, and a first body contact; and
a second TEG, said second TEG comprising a SOI-MOSFET having a second source electrode that extends to a second source region in the semiconductor layer, a second drain electrode that extends to a second drain region in the semiconductor layer, a second gate electrode, and second body, and a second body contact, the first gate electrode of said first TEG having a different area than the second gate electrode of said second TEG,
wherein said target SOI-MOSFET is a body-floating-gate type MOSFET and has a third source electrode that extends to a third source region in the semiconductor layer, a third drain electrode that extends to a third drain region in the semiconductor layer, a third gate electrode, and a third body but having no body contact, and
wherein said capacitance to be measured is the capacitance between the third body and third source electrode or between the third body and the third drain electrode.

* * * * *